United States Patent [19]

Hokanson et al.

[11] Patent Number: 5,027,362
[45] Date of Patent: Jun. 25, 1991

[54] LASER CONTROL METHOD AND CIRCUITRY

[75] Inventors: John L. Hokanson, Upper Milford Township, Lehigh County, Pa.; Robert G. Swartz, Tinton Falls, N.J.

[73] Assignee: AT&T Bell Laboratories, Murray Hill, N.J.

[21] Appl. No.: 291,899

[22] Filed: Dec. 29, 1988

[51] Int. Cl.$^5$ ............................................... H01S 3/00
[52] U.S. Cl. .......................................... 372/38; 372/29
[58] Field of Search .............................. 372/26, 29, 38; 455/609, 611

[56] References Cited

U.S. PATENT DOCUMENTS

| Re. 31,969 | 8/1985 | Sell | 372/38 |
|---|---|---|---|
| 4,009,385 | 2/1977 | Sell | 250/199 |
| 4,344,173 | 8/1982 | Straus | 372/38 |
| 4,612,671 | 9/1986 | Giles | 455/609 |
| 4,680,810 | 7/1987 | Swartz | 455/609 |
| 4,698,817 | 10/1987 | Burley | 372/31 |
| 4,868,836 | 9/1989 | Howard | 372/38 |

OTHER PUBLICATIONS

D. C. Smith et al., "Laser Level Control for High Bit Rate Optical Fibre Systems", *IEEE Proc. 13th Circuits and Systems Inc. Symposium*, Houston, 1980, pp. 926–930.

Primary Examiner—Frank Gonzalez
Attorney, Agent, or Firm—John A. Caccuro

[57] ABSTRACT

A laser biasing stabilization circuit and method uses the second derivative of the optical light output of a laser with respect to the current through the laser, $d^2L/dI^2$, in a feedback loop to control the laser bias current through the laser. The modulation current in the laser is controlled using a second, average power feedback loop.

18 Claims, 2 Drawing Sheets

LASER CONTROL METHOD AND CIRCUITRY

TECHNICAL FIELD

This invention relates to laser radiation sources and more particularly to a laser control method and apparatus.

BACKGROUND OF THE INVENTION

A semiconductor laser has two distinct regions of operation. At low currents, the ratio $\eta_1$ of the device's optical output L to input current I curve is small and the laser has a small bandwidth. As input current I is increased, it eventually reaches "threshold" current ($I_{th}$) and the device enters the lasing mode where the ration $\eta_2$ is much greater than $\eta_1$. Above threshold, the laser can have a very large bandwidth. In a digital application, the two most important operating points on the L-I curve are the logic ZERO and logic ONE optical output levels, $L_0$ and $L_1$. For optical communications, it is desirable to control the peak output level, $L_1$, and the "extinction ratio" ($\epsilon = L_1/L_0$) and to maximize the switching bandwidth of the laser.

In high speed applications, important factors such as bandwidth, turn-on delay and spectral purity are dependent on the proximity of the logic ZERO operating point, $I_0$, to the threshold current ($I_{th}$) level. In these high frequency applications, where precise location of the logic ZERO operating point is critical, and in low cost applications, where there is no laser cooling, it is extremely important to have some form of laser stabilization to allow exact control of both laser bias and modulation current parameters across a range of device characteristics, temperature and time.

Prior art laser control circuitries are arranged to set the laser bias current near $I_{th}$ such as the circuits described in U.S. Pat. No. 4,680,810 issued to R. G. Swartz on Jul. 14, 1987, or to maintain average laser output power at some predetermined level, such as described in U.S. Pat. No. 4,009,385, issued to D. D. Sell on Feb. 22, 1977.

In the Sell patent, in particular, a single loop feedback control maintains the average optical power. The biasing of the laser is derived in response to the difference between a signal derived from a reference level and a signal derived from the laser light output.

Another known biasing scheme uses threshold tracking, where a monitoring circuit is used to fix the dc bias current at $I_{th}$. For example, the previously-identified Swartz patent discloses a stabilization technique which uses the second or third derivatives of the voltage across a laser with respect to the current through the laser, i.e., $d^2V/dI^2$ or $d^3V/dI^3$, to indirectly control $L_0$. The $d^2V/dI^2$ curve exhibits two minima, one at threshold current $I_{th}$ and one at low bias currents. While the use of $d^2V/dI^2$ results in improved threshold current ($I_{th}$) tracking, the existence of two minima makes it more difficult to use a feedback circuit to establish a bias current $I_0$ below the threshold current $I_{th}$.

Reliable laser biasing is a continuing problem, especially in applications involving high performance and in low cost applications where uncontrolled laser temperature leads to wide variations in laser parameters. Moreover, in certain applications changes in the slope $\eta_2$ as well as $I_{th}$ with temperature and time should be controlled. Prior art arrangements have not accounted for both parameter changes.

SUMMARY OF THE INVENTION

We have discovered an improved biasing stabilization circuit and method for a laser which utilizes the second derivative of the optical light output (L) of the laser with respect to the input current (I) through the laser, i.e, $d^2L/dI^2$, to control the light output parameters ($L_0$, $L_1$) of the laser. Because $d^2L/dI^2$ has only one minimum point, near threshold current $I_{th}$, it is more easily detected and set at a predetermined value by a control feedback loop.

In accordance with one aspect of the present invention, a $d^2L/dI^2$ feedback loop is used to stabilize the bias current $I_0$ to a level near the threshold current $I_{th}$, and a second average power feedback loop controls the modulation current $I_M$. In such a dual loop arrangement, the logic ZERO light level is stabilized at a value corresponding to threshold current $I_{th}$; and the logic ONE light level is controlled by a preset average power level to minimize variations in laser device parameters caused by temperature, aging, etc.

DETAILED DESCRIPTION

Figure 1:
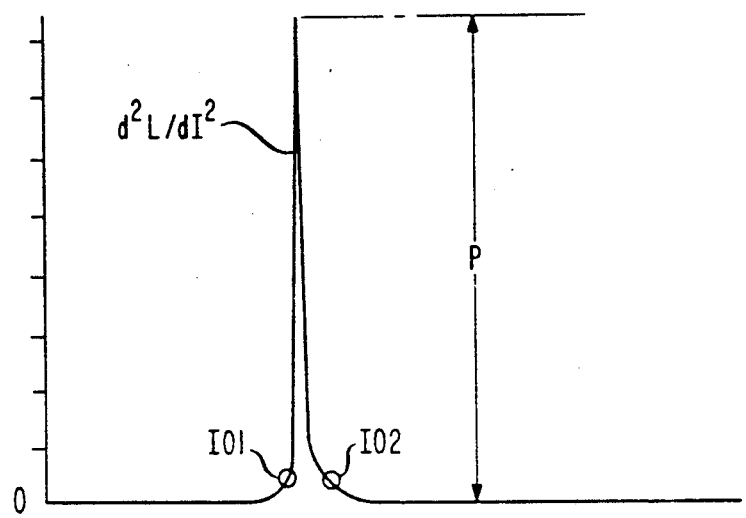
FIGS. 1-3 show curves depicting the second derivative ($d^2L/dI^2$) of the L-I curve (laser luminosity-current curve), the first derivative (dL/dL) of the L-I curve, and the laser luminosity (L) as a function of laser current (I), respectively.
Figure 2:
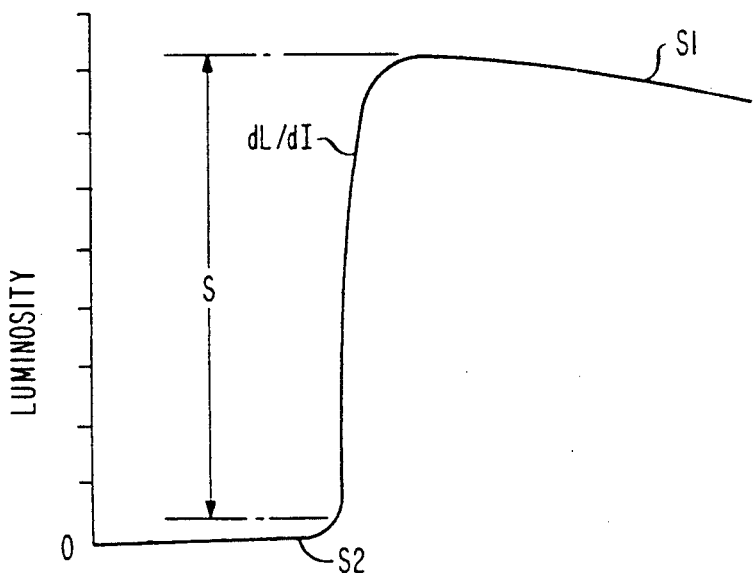
Figure 3:
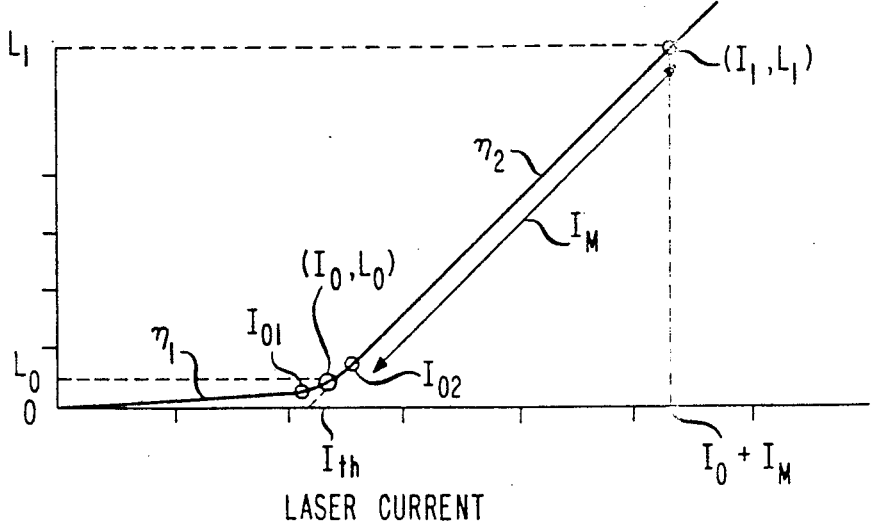

With reference to FIGS. 1-3, there are illustrated plots of laser luminosity L as a function of laser current I (L-I curve shown in FIG. 3), the first derivative of the L-I curve (dL/dI shown in FIG. 2), and the second derivative of the L-I curve ($d^2L/dI^2$ shown in FIG. 1). The basic parameters of a laser are illustrated on the L-I curve and include $I_{th}$, the threshold current; $\eta_1$, the slope of the L-I curve below $I_{th}$; and $\eta_2$, the slope of the L-I curve above $I_{th}$. Also shown on the L-I curve are typical operating points $I_0$, $L_0$ and $I_1$, $L_1$, where $I_1$ is $I_0 + I_M$, being the amplitude of a digital modulation current signal.

As previously discussed, for a given modulation current ($I_M$), detection of the optical signal is increased when the extinction ratio, $\epsilon = L_1/L_0$, increases. Thus, applications requiring the highest extinction ratio require a sub-threshold bias, $I_{01} < I_{th}$ (see $I_{01}$ of FIGS. 1 and 3). However, in applications requiring the highest operating speed, the laser current $I_{02}$ should be above threshold $I_{th}$ (see $I_{02}$ of FIG. 2).

It is known that with increases in the operating temperature of the laser, the lasing threshold $I_{th}$ increases while the slope $\eta_2$ decreases. Consequently, the knee of the L-I curve becomes less sharp with increases in temperature. Ensuring satisfactory laser operations requires that the bias current be maintained around threshold $I_{th}$ independent of changes in operating conditions (laser aging, temperature, data duty cycle and data rate). Thus, the laser bias point $I_0$ should be automatically readjusted with changes in these parameters. Readjustment of $I_0$ requires that the threshold $I_{th}$ be readily detectable with variation in the laser operating parameters. However, because the sharpness of the knee of the L-I curve varies greatly with operating parameters, (dL/dI) is not a reliable characteristic to use to detect changes in the threshold $I_{th}$.

As described above, variations in bit rate, duty cycle of the data, and laser operating temperature all result in changes in the values of dL/dI above and below threshold $I_{th}$ making it difficult, if not impossible, to locate a stable ($I_0$) bias operating point.

We have discovered, however, that these operating parameter variations have little effect on the $d^2L/dI^2$ curve because the slope of the dL/dI curve (see S1 and S2 on FIG. 1) remains close to zero above and below threshold. Moreover, we have discovered that the $d^2L/dI^2$ curve is characterized by a distinct peak (P of FIG. 1) marking the location of threshold current ($I_{th}$) and (for some lasers) sharp transitions on either side of the peak such that the curve falls to near-zero levels both above and below threshold. Hence, the $d^2L/dI^2$ peak P represents a readily detectable characteristic which identifies the location of threshold $I_{th}$ and can be used for controlling laser biasing.

Moreover, the only characteristic of $d^2L/dI^2$ that will vary significantly with parameter variations is the magnitude of the peak P at threshold ($I_{th}$). Specifically, P will decrease as temperature increases. However, when $d^2L/dI^2$ is detected as part of a closed-loop feedback circuit, the magnitude of the detected $d^2L/dI^2$ peak is increased by the electronic gain of the feedback circuit. Thus the measured peak can be adjusted to a readily detectable value by increasing the electronic gain of the feedback loop. Furthermore, as is well known in control theory, if the overall open loop gain is large enough, then its precise value is insignificant, and wide variations can therefore be tolerated in P without appreciable change in the feedback-stabilized operating point ($I_0$) of the loop. Hence, the peak P of $d^2L/dI^2$ is a readily detectable and stable characteristic which can be utilized as a reference to establish the $I_0$ bias point of the laser.

In accordance with the present invention, an electronic algorithm is utilized to accurately measure the $d^2L/dI^2$ characteristic in a time which is short compared to the necessary response time of the feedback loop. According to an aspect of the present invention, the algorithm can be implemented inexpensively in integrated circuit form.

An algorithm which meets these conditions is disclosed in the previously identified Swartz patent. In the Swartz patent, however, the algorithm is used to generate derivatives of voltage across a laser with respect to the laser bias current (e.g., $d^2V/dI^2$). As shown in FIG. 2 of the Swartz patent, the $d^2V/dI^2$ curve has a null or notch (A,B) at the threshold current ($I_{th}$) and another null or dip in the curve (D) at lower bias currents. The existence of two nulls makes detection of the threshold current $I_{th}$ more difficult. Consequently, the Swartz patent states (column 8, lines 53-57) that a simple feedback scheme typically cannot use only $d^2V/dI^2$ to optimally determine the bias point of a laser. The present invention recognizes that the second derivative of the light output of a laser with respect to the laser bias current (i.e., $d^2L/dI^2$) has only one distinct peak at the threshold current ($I_{th}$) and as such could be used to control an operating characteristic of a laser (i.e., bias threshold $I_0$, peak light output L, or modulation level).

Figure 4:
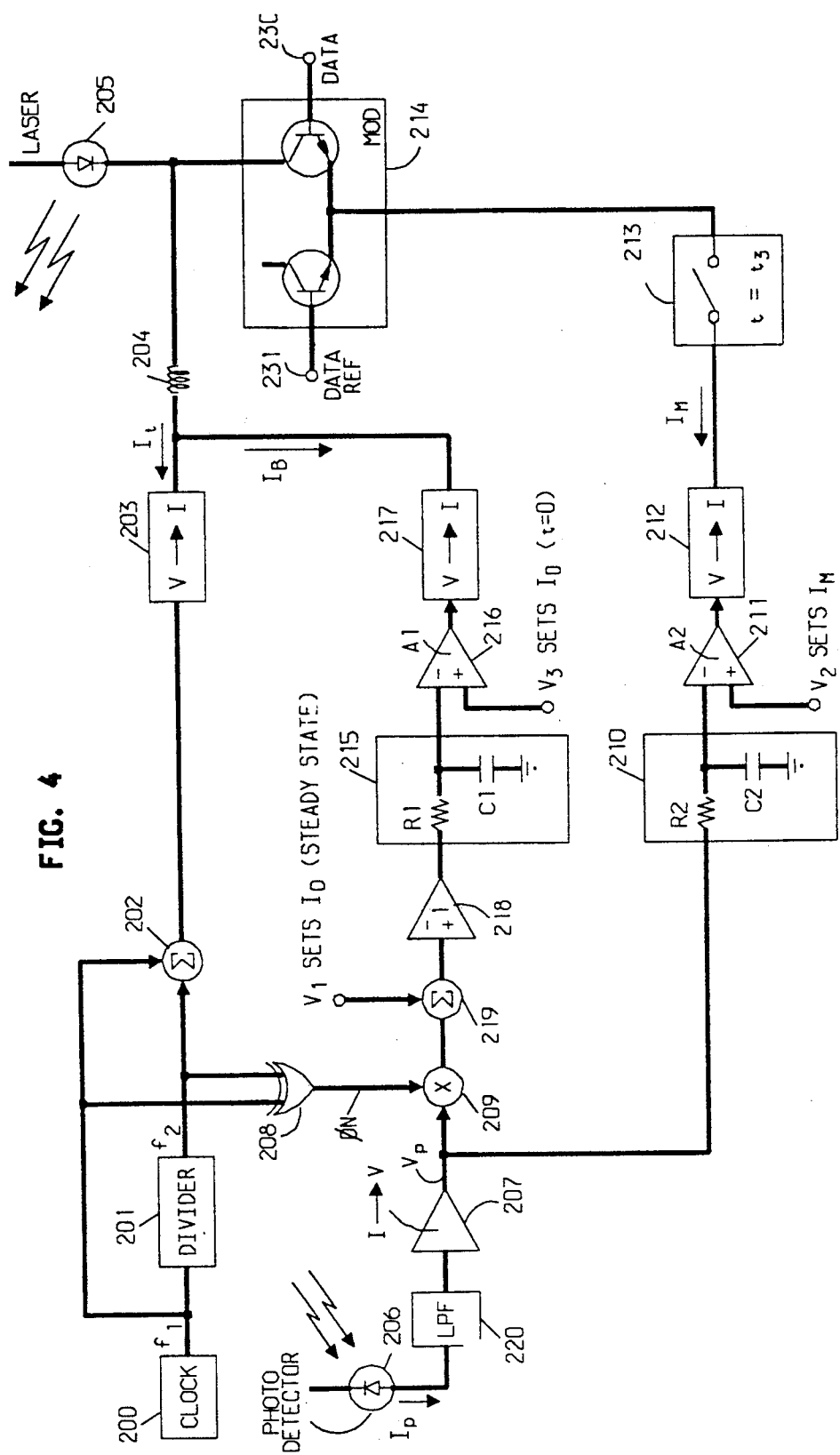
FIG. 4 shows a block diagram of an exemplary dual loop laser stabilization circuit incorporating the present invention to control bias current and modulation current.

The dual loop laser stabilization circuit of FIG. 4 will now be described. The first loop has means for determining $d^2L/dI^2$ which is used to control the bias current $I_0$ in accordance with the present invention. In FIG. 4, the $d^2L/dI^2$ determining means includes, illustratively, clock 200, divider 201, summer 202, transconductance circuit 203, inductor 204, laser 205, photodetector 206, low pass filter 220, transimpedance amplifier 207, exclusive-or circuit 208, multiplier circuit 209 and low pass filter 215. The $d^2L/dI^2$ signal is generated and used by a control circuit (e.g., 215, 216, 217, 218, 219) as part of a feedback loop to control the bias current $I_0$ of the laser. The $d^2L/dI^2$ bias current loop includes test current $I_t$ generator components 200-203, inductor 204, laser 205, photodetector 206, low pass filter 220, amplifier 207, and bias current control circuit 208, 209, 215-219.

A second feedback loop uses the average output power of laser 205 to set and control the laser modulation current $I_M$. The second feedback loop includes, illustratively, laser 205, photodetector 206, low pass filter 220, amplifier 207 and modulation current control circuit 210-214.

Before discussing the detailed operation of the embodiment shown in FIG. 4, the general operation of the circuit is described with reference to FIGS. 1, 3 and 4.

In the embodiment shown in FIG. 4, as previously described, the $d^2L/dI^2$ characteristic is used to control the bias current $I_0$ (see FIG. 1), and an average power loop is used to control modulation current $I_M$. The reference voltages V1 and V3 (of FIG. 4) set bias current $I_0$. The $I_0$ steady state current is proportional to the difference between reference voltages V1 and V3 (i.e., V3−V1). The initial bias current $I_0$ at t=0 (i.e., when power is applied) is proportional to reference voltage V3. Since reference voltages V1 and V3 are independent, the initial and steady state currents can be established independently.

In the embodiment of FIG. 4, the laser 205 can be biased either below or above threshold $I_{th}$ by setting the gain of amplifier 218 and the reference voltage V3. In the sub-threshold bias mode when power is first applied to the circuit, the bias current $I_0$ starts initially at zero and increases to value $I_{01}$ just below the $d^2L/dI^2$ peak as is shown on FIG. 1. In this sub-threshold bias mode the gain of amplifier 218 is set at plus one, reference voltage V3 is set to zero and reference voltage V1 is less than zero.

The above-threshold bias mode is established by inverting the gain of the amplifier 218 and setting V3 greater than zero. In this above-threshold mode the bias current at power-on starts at a current greater than $I_{th}$, and decreases until $d^2L/dI^2$ peaks near $I_{02}$. Because bias current $I_0$ can be set to stabilize at either $I_{01}$ or $I_{02}$, the laser bias stabilizing circuit of FIG. 4 can be optimized, respectively, for bandwidth ($I_{02}$) or extinction ratio ($I_{01}$).

In another embodiment (not shown) the reference voltage V1 could be followed by another low pass filter 215 circuit and combined with reference voltage V3 as the positive input to comparator 216.

After the bias current $I_0$ is established, the modulation current loop is enabled at time t=t3 (see 213 of FIG. 4). The modulation current $I_M$ increases until the desired average operating power of the laser 205 is reached. The average laser operating power is set using voltage V2 of comparator 211 which controls the modulation current $I_M$.

In the embodiment of FIG. 4, the time constant of the $d^2L/dI^2$ loop (T1=R1×C1) is shorter than the time constant of the average power loop (T2=R2×C2). Thus, when a change in operating conditions occurs, the circuit first stabilizes the bias current $I_0$ and then adjusts the modulation current $I_M$.

With reference to FIG. 4, the details of a dual loop laser stabilization circuit which uses $d^2L/dI^2$ loop to control bias current $I_0$ and an average power loop to control modulation current $I_M$ are described in accordance with the present invention. Using a circuit similar to FIG. 5 of the Swartz patent, a test current ($I_t$) is generated using circuits 200-203. An oscillator or clock 200 is used to provide a clock signal at frequency $f_1$ of 50% duty cycle. A digital divider circuit 201 divides clock signal $f_1$ to generate signal $f_2$. A separate oscillator could also be used to generate $f_2$. The digital signals $f_1$ and $f_2$ are analog summed by summer 202 and the output voltage is converted to a test current ($I_t$) by transconductance circuit 203. Test current $I_t$ is injected into laser 205 via inductor 204. The inductor by convention serves to isolate the low frequency transconductance amplifiers 203 and 217 from the high frequency modulator 214. In optimally designed configurations, it may be omitted.

The light output from laser 205 is coupled to monitoring photodetector 206. Photodetector 206 monitors light from laser 205 and outputs a current $I_P$ proportional to the instantaneous optical output power of laser 205. Low pass filter 220 filters out the high frequency data modulation signal to prevent the saturation of amplifier 207. In accordance with the present invention, the filtered output current $I_P$ of photodetector 206 is used in both a first (average power) and a second ($d^2L/dI^2$), i.e., dual, feedback loops. Transimpedance amplifier 207 converts the filtered photocurrent $I_P$ from photodetector 206 to a voltage $V_P$.

A partial product $\phi N$ is produced from digital signals $f_1$ and $f_2$ using exclusive-or circuit 208. A double-balanced mixer or multiplier 209 is used to analog multiply $\phi N$ by a voltage $V_P$ proportional to the detected photocurrent $I_P$. The output of mixer 209 is summed with reference voltage $V_1$ using summing circuit 219. The summed output is buffered by amplifier 218 and then passed through low pass filter 215 having time constant $T1 = R1 \times C1$. The procedure just described involving circuits 200-209, 215, 218-220 generates the second derivative $d^2L/dI^2$ signal as the output of low pass filter 215. Filter 215 also establishes a dominant pole in the signal path that serves to stabilize the feedback control loop.

The second derivative $d^2L/dI^2$ signal is compared with reference signal $V_3$ using comparator 216. The feedback loop adjusts the bias current $I_0$ to the laser so that the detected value of $d^2L/dI^2$ corresponds to a bias either just below ($I_{01}$) or just above ($I_{02}$) threshold. The selection of $I_{01}$ or $I_{02}$ is controlled by the polarity of the electronic gain of buffer amplifier 218, and by the reference voltage $V_3$, thus determining the value of bias current when power is first applied to the circuit.

In accordance with another aspect of the present invention, circuitry is provided to prevent interference between the dual feedback loops. When power is first applied to the circuit, the $d^2L/dI^2$ loop that sets bias current $I_0$ is allowed to stabilize first, near threshold at $I_{01}$ or $I_{02}$, before the data modulation current $I_M$ is applied. This is needed because the data modulation current $I_M$ can cause a false sub-threshold peak at a bias current of $I_0 = I_{01} - I_M$, which will inhibit initial threshold locking. At $t=0$, power is applied to the $d^2L/dI^2$ loop, while circuit 213 keeps the (average power) modulation current $I_M$ loop disabled. After a time sufficient to allow the $d^2L/dI^2$ loop to set dc bias current $I_0$ ($t = t3$), the circuit 213 enables the average power feedback loop. The average power feedback loop adjusts $I_M$ (see FIG. 3) until the proper average power is obtained. Meanwhile, the $d^2L/dI^2$ loop maintains dc bias $I_0$ at threshold.

The operation of the above-described average power feedback loop adjusts the modulation current $I_M$ of laser 205, resulting in an optimum modulation current $I_M$ setting with variations in laser temperature, data signals, etc.

The second feedback loop measures the average value of the photocurrent $I_P$. Voltage $V_P$ is proportional to the detected photocurrent $I_P$ and is filtered in filter 210 having a time constant $T2 = R2 \times C2$. Filter 210 removes the low frequency test signal proportional to $I_t$, and also assures the stability of the average power feedback loop. The output of filter 210 is proportional to the average power of laser 205. Comparator 211 compares filtered voltage $V_P$ with reference $V_2$, and the output of 211 is converted to a current $I_M$ by transconductance circuit 212. Reference signal $V_2$ is duty-cycle compensated so that its dc level changes in proportion to the duty cycle of the data signal 230. The voltage reference $V_2$ is used to establish the modulation current $I_M$ at a value corresponding to a peak output light level of $L_1$ as shown in FIG. 3. Hence, the laser current is $I_0$ for a logic ZERO data signal and $I_0 + I_M$ for a logic ONE data signal.

In order to prevent interference between the $d^2L/dI^2$ and average power loops after they are both active, it is necessary that the time constant T1 of the $I_0$ loop ($d^2L/dI^2$ loop) be much smaller than T2, the time constant of the $I_M$ loop (average power loop).

The analog and digital circuits of the present invention can be implemented using well-known discrete or integrated circuits using silicon bipolar technology or FET technology, as well as non-silicon technologies (for example, gallium arsenide FET or bipolar).

What has been described is merely illustrative of the application of the principles of the present invention. Other apparatus and circuits can be implemented by those skilled in the art without departing from the spirit and scope of the present invention.

What is claimed is:

1. A laser circuit comprising
   means for determining a second derivative signal which is a function of the second derivative of the light output (L) from the laser with respect to the current (I) through the laser ($d^2L/dI^2$);
   control means responsive to said second derivative signal for establishing a laser bias current which results when said second derivative signal equals a predetermined level; and wherein
   said determining means includes
   means for combining a test current with said bias current,
   detector means for generating a light signal proportional to the light output from said laser,
   test current generating means for generating said test current proportional to the sum of first and second frequency signals,
   product means for generating a product signal proportional to the product to said first and second frequency signals,
   signal mixer means for mixing said light signal and said product signal, and low pass filter means for filtering said mixer output to produce said second derivative signal.

2. The laser circuit of claim 1 wherein
said control means includes
comparator means for comparing said second derivative signal with a reference signal to establish said bias current and
said reference signal varies with time such that initial and final levels of the reference signal are established independently.

3. The laser circuit of claim 2 wherein
said initial reference signal is established at a level which sets the initial laser bias current during start-up at a level which exceeds the threshold current of the laser.

4. The laser circuit of claim 2 wherein
said initial reference signal is established at a level which sets the initial laser bias current during start-up at a level which is below the threshold current of the laser.

5. The laser circuit of claim 1 further comprising
feedback means responsive to said light output for controlling a laser modulation current which establishes the average output power of said laser at a predetermined level.

6. The laser circuit of claim 5 wherein said feedback means includes
second means for comparing said light output with a reference signal and for adjusting said modulation current in response to said comparison.

7. The laser circuit of claim 6 wherein said reference signal is proportional to the duty cycle of an input data signal to said laser.

8. The laser circuit of claim 1 further comprising
means for disabling the combining of a modulating current with said bias current for a predetermined time period following the application of bias current to said laser.

9. The laser circuit of claim 1 wherein said determining means and said control means form a bias current feedback loop means for stabilizing the bias current during any change in an operating characteristic of the laser.

10. A laser circuit comprising
means for determining a second derivative signal which is a function of the second derivative of the light output (L) from the laser with respect to the current (I) through the laser ($d^2L/dI^2$);
control means responsive to said second derivative signal for establishing a laser bias current which results when said second derivative signal equals a predetermined level; and wherein
said control means includes
comparator means for comparing said second derivative signal with a reference signal to establish said bias current,
said reference signal varies with time such that initial and final levels of the reference signal are established independently, and
said initial reference signal being established at a level which sets the initial laser bias current during start-up at a level which exceeds the threshold current of the laser.

11. The laser circuit of claim 10 further comprising
feedback means responsive to said light output for controlling a laser modulation current which establishes the average output power of said laser at a predetermined level.

12. The laser circuit of claim 11 wherein said feedback means includes
second means for comparing said light output with a second reference signal and for adjusting said modulation current in response to said comparison.

13. The laser circuit of claim 12 wherein said second reference signal is proportional to the duty cycle of an input data signal to said laser.

14. The laser circuit of claim 10 further comprising
means for disabling the combining of a modulating current with said bias current for a predetermined time period following the application of bias current to said laser.

15. The laser circuit of claim 10 wherein said determining means and said control means form a bias current feedback loop means for stabilizing the bias current during any change in an operating characteristic of the laser.

16. The laser circuit of claim 10 wherein said determining means includes
means for combining a test current with said bias current,
detector means for generating a light signal proportional to the light output from said laser,
test current generating means for generating said test current proportional to the sum of first and second frequency signals,
product means for generating a product signal proportional to the product of said first and second frequency signals, and
signal mixer means for mixing said light signal and said product signal, and
low pass filter means for filtering said mixer output to produce said second derivative signal.

17. A method of biasing a laser circuit comprising the steps of
determining a second derivative signal which is a function of the second derivative of the light output (L) from the laser with respect to the current (I) through the laser ($d^2L/dI^2$);
establishing in response to said second derivative signal a laser bias current which results when said second derivative signal equals a predetermined level; and wherein
the determining step includes the steps of
combining a test current with said bias current,
generating a light signal proportional to the light output from said laser,
generating said test current proportional to the sum of first and second frequency signals,
generating a product signal proportional to the product of said first and second frequency signals,
mixing said light signal and said product signal, and
filtering said mixer output to produce said second derivative signal.

18. The method of claim 17 further comprising the step of
controlling with a feedback means a modulation current through said laser to maintain the average output power of said laser at a predetermined level.

* * * * *